United States Patent
Huang

(10) Patent No.: US 9,153,739 B2
(45) Date of Patent: *Oct. 6, 2015

(54) LIGHT EMITTING DEVICES WITH TEXTURED ACTIVE LAYER

(71) Applicant: TSMC Solid State Lighting Ltd., Hsinchu (TW)

(72) Inventor: Hsin-Chieh Huang, Hsin-Chu (TW)

(73) Assignee: TSMC SOLID STATE LIGHTING, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/210,522

(22) Filed: Mar. 14, 2014

(65) Prior Publication Data

US 2014/0191191 A1 Jul. 10, 2014

Related U.S. Application Data

(60) Continuation of application No. 13/632,212, filed on Oct. 1, 2012, now Pat. No. 8,673,666, which is a division of application No. 12/720,462, filed on Mar. 9, 2010, now Pat. No. 8,299,479.

(51) Int. Cl.
*H01L 33/22* (2010.01)
*H01L 33/04* (2010.01)
*H01L 33/24* (2010.01)

(52) U.S. Cl.
CPC ............... *H01L 33/22* (2013.01); *H01L 33/04* (2013.01); *H01L 33/24* (2013.01)

(58) Field of Classification Search
None
See application file for complete search history.

(56) References Cited

U.S. PATENT DOCUMENTS

| | | | |
|---|---|---|---|
| 4,868,614 A | 9/1989 | Yamazaki | |
| 5,061,974 A | 10/1991 | Onodera et al. | |
| 5,115,443 A | 5/1992 | Miyazawa | |
| 5,153,890 A | 10/1992 | Bona et al. | |
| 5,400,356 A | 3/1995 | Bringans et al. | |
| 6,828,591 B2* | 12/2004 | Okuyama et al. | 257/89 |
| 7,030,421 B2 | 4/2006 | Okuyama et al. | |
| 7,410,819 B2 | 8/2008 | Takakura et al. | |
| 7,419,912 B2 | 9/2008 | Donofrio | |
| 7,956,370 B2* | 6/2011 | Pan | 257/95 |
| 7,982,205 B2 | 7/2011 | Wang | |
| 8,134,163 B2 | 3/2012 | Yu et al. | |
| 8,183,588 B2 | 5/2012 | Edmond et al. | |
| 8,299,479 B2* | 10/2012 | Huang | 257/94 |
| 8,673,666 B2* | 3/2014 | Huang | 438/43 |
| 2006/0094244 A1 | 5/2006 | Yamada et al. | |
| 2008/0048176 A1 | 2/2008 | Orita et al. | |
| 2008/0308835 A1* | 12/2008 | Pan | 257/103 |
| 2009/0032799 A1 | 2/2009 | Pan | |

(Continued)

OTHER PUBLICATIONS

Definition of recess downloaded from URL < http://www.merriam-webster.com/dictionary/recess > on Sep. 5, 2014.*

(Continued)

*Primary Examiner* — Joseph Schoenholtz
(74) *Attorney, Agent, or Firm* — Muncy, Geissler, Olds & Lowe, P.C.

(57) ABSTRACT

A device includes a textured substrate having a trench extending from a top surface of the textured substrate into the textured substrate, wherein the trench comprises a sidewall and a bottom. A light-emitting device (LED) includes an active layer over the textured substrate. The active layer has a first portion parallel to the sidewall of the trench and a second portion parallel to the bottom of the trench.

19 Claims, 8 Drawing Sheets

(56) References Cited

U.S. PATENT DOCUMENTS

| | | | |
|---|---|---|---|
| 2009/0159869 A1* | 6/2009 | Ponce et al. | 257/13 |
| 2009/0179211 A1 | 7/2009 | Yoo et al. | |
| 2010/0265981 A1 | 10/2010 | Hiroyama et al. | |
| 2010/0308437 A1 | 12/2010 | Okuno et al. | |
| 2011/0114917 A1* | 5/2011 | Pan | 257/13 |
| 2011/0198637 A1* | 8/2011 | Huang | 257/98 |
| 2011/0220930 A1* | 9/2011 | Huang | 257/98 |

OTHER PUBLICATIONS

Definition of indentation downloaded from URL http://www.merriam-webster.com/dictionary/indentation on Sep. 7, 2014.*

Definition of trench downloaded from URL <http://www.merriam-webster.com/dictionary/trench > on Sep. 7, 2014.*

Definition of 'strip' includes a 'long narrow piece of something' see definition of strip downloaded from URL < http://www.merriam-webster.com/dictionary/strip > on Jan. 29, 2015.*

Definition of 'rectangle' downloaded from URL < http://www.merriam-webster.com/dictionary/rectangle > on Jan. 29, 2015.*

Definition of geometry downloaded from URL< http://www.merriam-webster.com/dictionary/geometry> on Sep. 5, 2014.*

Mori, Yoshifumi, et al., "Single Mode Laser with a V-shaped Active Layer Grown by Metalorganic Chemical Vapor Deposition: A V-shaped Double Heterostructure Laser," Journal of Applied Physics 52.9 (1981): 5429, 6 pages.

Kneissl, M, et al., "Dry-etching and Characterization of Mirrors on III-nitride Laser Diodes from Chemically Assisted Ion Beam Etching," Journal of Crystal Growth 1898-190 (1998): 846-849.

Palmeri, M., "Laser Micromachining: Advantages of Liquid Environments", Research Experience for Undergraduates, Princeton University 2005 downloaded from URL< http://www.princeton.edu/pccmeducation/undergrad/reu/researchprojects/REU2005Presentations/palmeri.pdf> on Aug. 14, 2013.

Marella, Paul F., David B. Tuckerman, and R. Fabian Pease. "Modeling of Laser Planarization of Thin Metal Films" Applied Physics Letters 54.12 (1989): 1109.

* cited by examiner

LIGHT EMITTING DEVICES WITH TEXTURED ACTIVE LAYER

PRIORITY DATA

This application is a Continuation application of Ser. No. 13/632,212, filed on Oct. 1, 2012 which is a Divisional Application of Ser. No. 12/720,462, filed on Mar. 9, 2010 and issued as U.S. Pat. No. 8,299,479 on Oct. 30, 2012, the disclosures of each of which are incorporated herein by reference in their entirety.

TECHNICAL FIELD

This disclosure relates generally to light-emitting devices (LEDs), and more particularly to the methods of manufacturing LEDs with textured active layers and the resulting structures.

BACKGROUND

Light-emitting devices (LEDs), such as light-emitting diodes or laser diodes, are widely used for many applications. As is well known to those skilled in the art, an LED may include a semiconductor light-emitting element having a plurality of semiconductor layers formed on a substrate. The substrate may be formed of, for example, gallium arsenide, gallium phosphide, alloys thereof, silicon carbide, and/or sapphire. Continued development in LEDs has resulted in highly efficient and mechanically robust light sources that can cover the visible spectrum and beyond. These attributes, coupled with the potentially long service life of solid state devices, may enable a variety of new display applications, and may place LEDs in a position to compete with the well entrenched incandescent and fluorescent lamps.

LEDs emit light from active layers. Accordingly, light may be extracted from the opposite sides of the active layers. However, in certain situations, for example, when an LED is used for illumination, it may be preferred that the light is directed to only one side of the LED, with the light being scattered to achieve a more uniform light distribution. Conventionally, patterned package substrates were bonded to LED chips to re-direct light to desirable directions. This solution, however, results in an increase in the cost and complexity in the formation of the package substrates and the bonding process for bonding LED chips to the package substrates. In addition, the solutions in package substrates did not help improve the light-extraction efficiency.

SUMMARY

In accordance with one aspect, a device includes a textured substrate having a trench extending from a top surface of the textured substrate into the textured substrate, wherein the trench comprises a sidewall and a bottom. A light-emitting device (LED) includes an active layer over the textured substrate. The active layer has a first portion parallel to the sidewall of the trench and a second portion parallel to the bottom of the trench.

Other embodiments are also disclosed.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative and do not limit the scope of the disclosure.

A novel light-emitting device (LED) in accordance with an embodiment and the method of forming the same are presented. The intermediate stages of manufacturing an embodiment are illustrated. The variations and the operation of the embodiment are then discussed. Throughout the various views and illustrative embodiments, like reference numbers are used to designate like elements.

Figure 1:
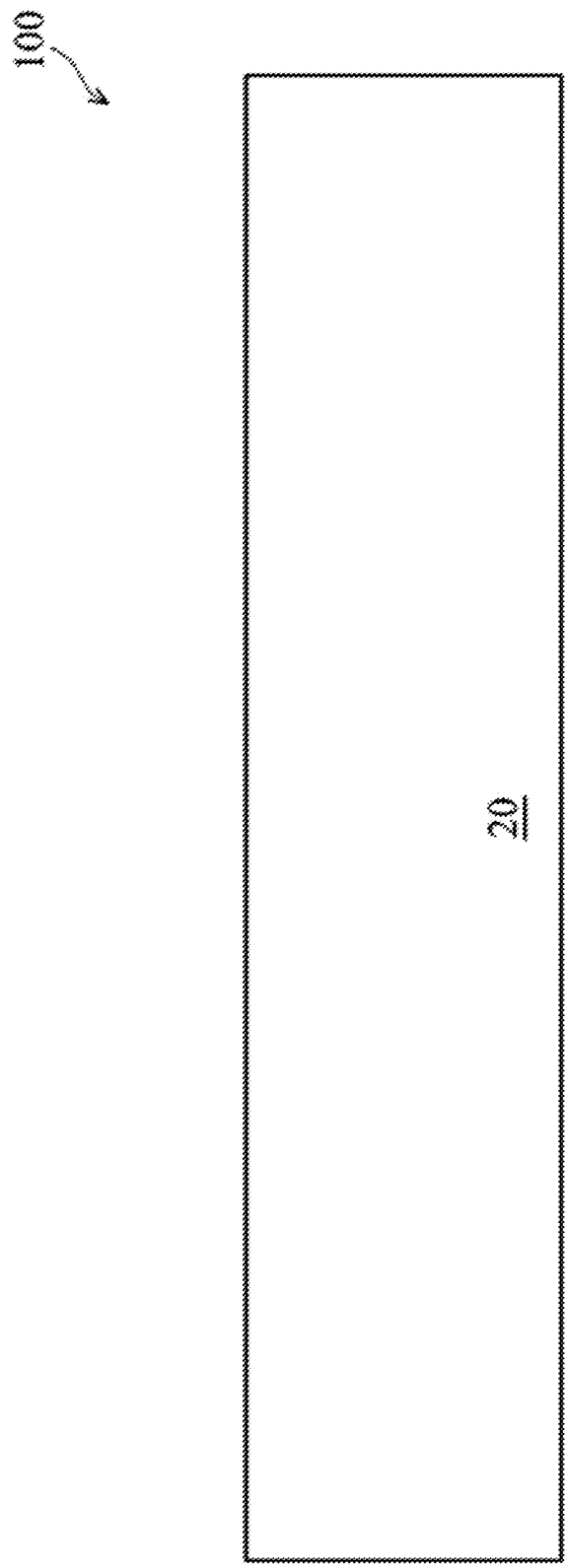
FIGS. 1 through 5 are cross-sectional views and top views of intermediate stages in the manufacturing of a light-emitting device (LED) in accordance with an embodiment, which LED is formed on a textured substrate.

Referring to FIG. 1, chip 100, which comprises substrate 20, is provided. Chip 100 may be a part of an un-diced wafer comprising a plurality of identical chips. In an embodiment, substrate 20 is formed of sapphire ($Al_2O_3$). In alternative embodiments, substrate 20 is a silicon-containing substrate, such as a silicon carbide substrate or silicon. In yet other embodiments, substrate 20 comprises compound semiconductor materials comprising group-III and/or group-V elements, or also known as III-V compound semiconductor materials.

Figure 2:
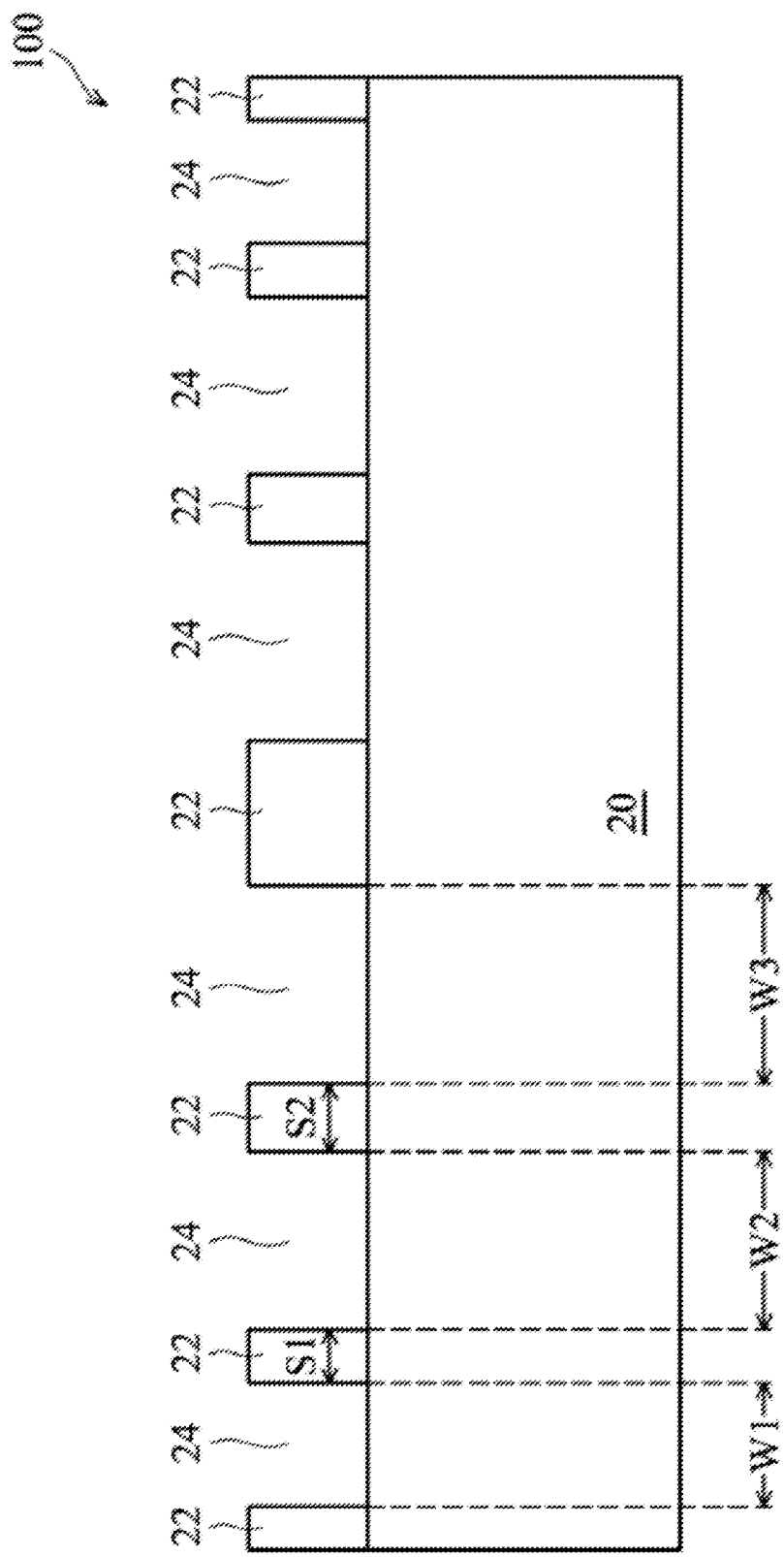

Photo resist 22 is formed on substrate 20 and is patterned to form a plurality of openings 24, as shown in FIG. 2. In an embodiment, the horizontal dimensions (widths or lengths, for example, W1, W2, and W3) of openings 24 may be different from opening to opening, although the horizontal dimensions of openings 24 may also be the same throughout chip 100. Further, spacings (for example, S1 and S2) between neighboring openings 24 may be the same or different from each other. Accordingly, the pattern densities of openings 24 may have variations in different regions of chip 100, wherein the pattern density of openings 24 in a region equals the total area of openings 24 in the region divided by the total area of the region. In the embodiment wherein the horizontal dimensions and spacings of openings 24 are substantially uniform throughout chip 100, the pattern densities of openings 24 are substantially uniform throughout chip 100.

Figure 3A:
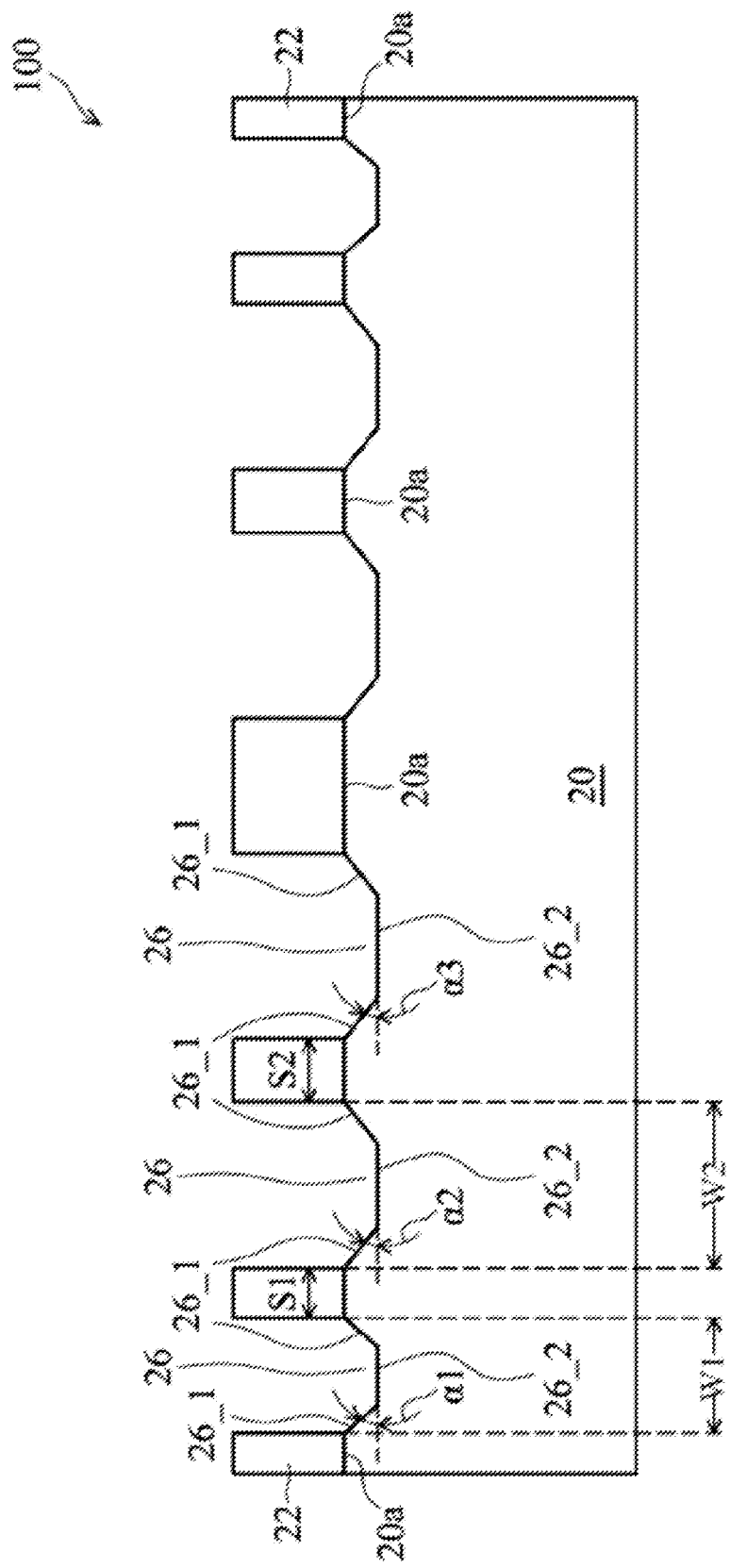

Referring to FIG. 3A, substrate 20 is etched through openings 24 to form a plurality of discrete trenches 26, which extend from top surface 20a of substrate 20 into substrate 20. The resulting substrate 20 is referred to as a textured substrate hereinafter. The resulting surface of substrate 20 that includes trenches 26 is referred to a textured top surface, which comprises portions of the original top surface 20a, sidewalls 26_1 of trenches 26, and bottoms 26_2 of trenches 26. In an embodiment, sidewalls 26_1 and bottoms 26_2 are substantially straight in the cross-sectional view, although they may also be curved. The etching may be a dry etching, although other etching methods may also be used. Through the adjustment of process conditions of the etching process, slant angles α (illustrated as α1, α2, α3, and so on) of sidewalls 26_1 may be adjusted to less than about 45 degrees and greater than about 1 degree (or greater than about 10 degrees or 15 degrees) from horizontal, or between about 10 degrees and about 45 degrees from horizontal, or even between about 15 degrees and about 35 degrees from horizontal. Photo resist 22 is then removed.

Figure 3B:
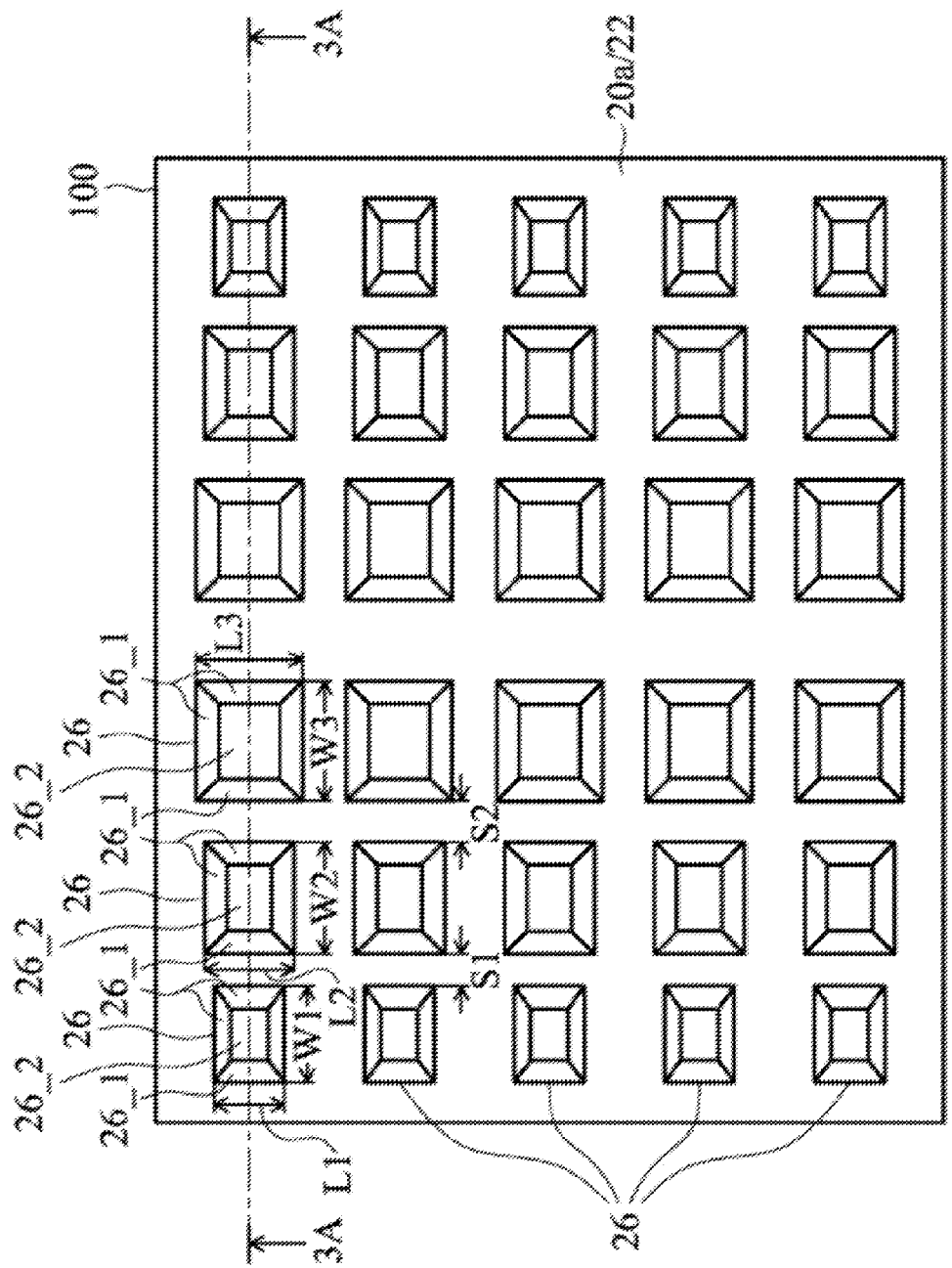
Figure 3C:
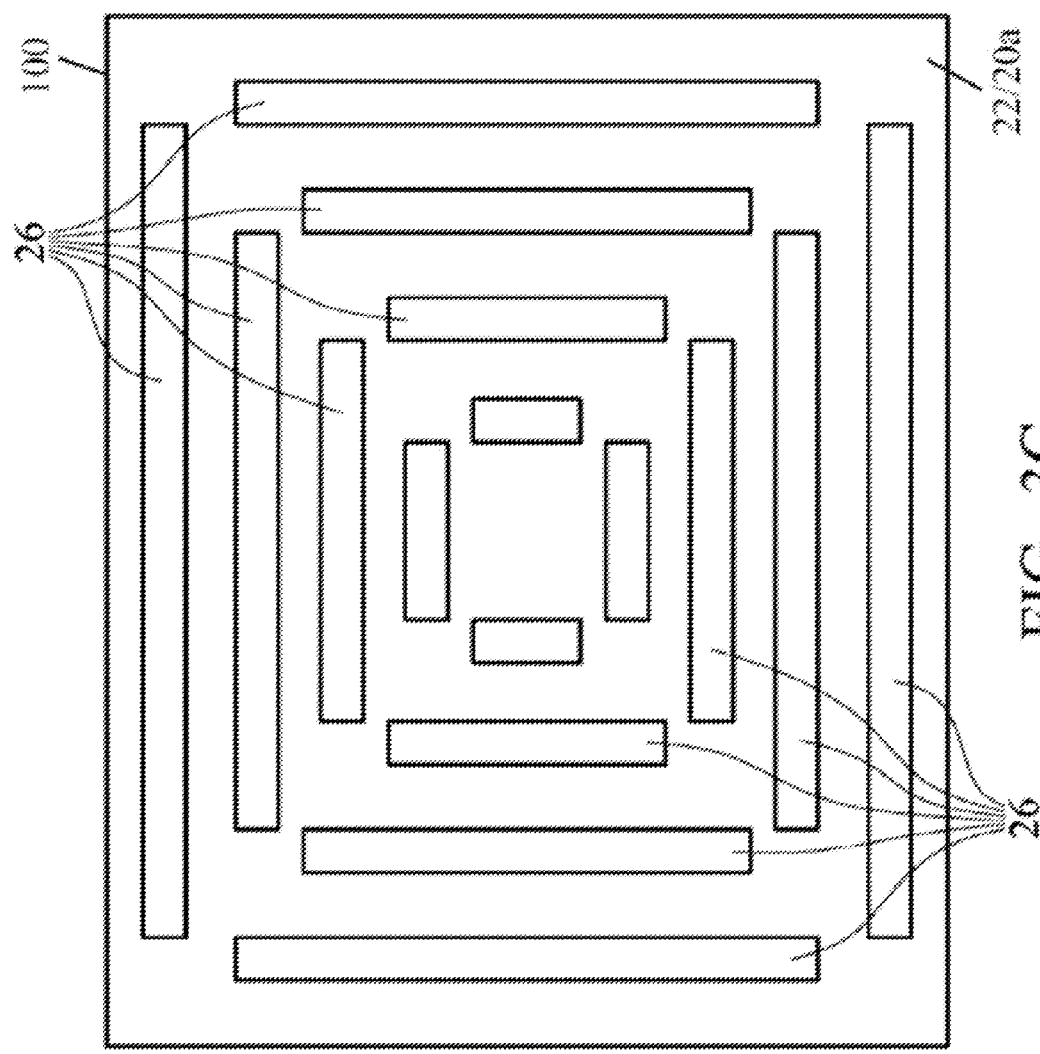
Figure 3D:
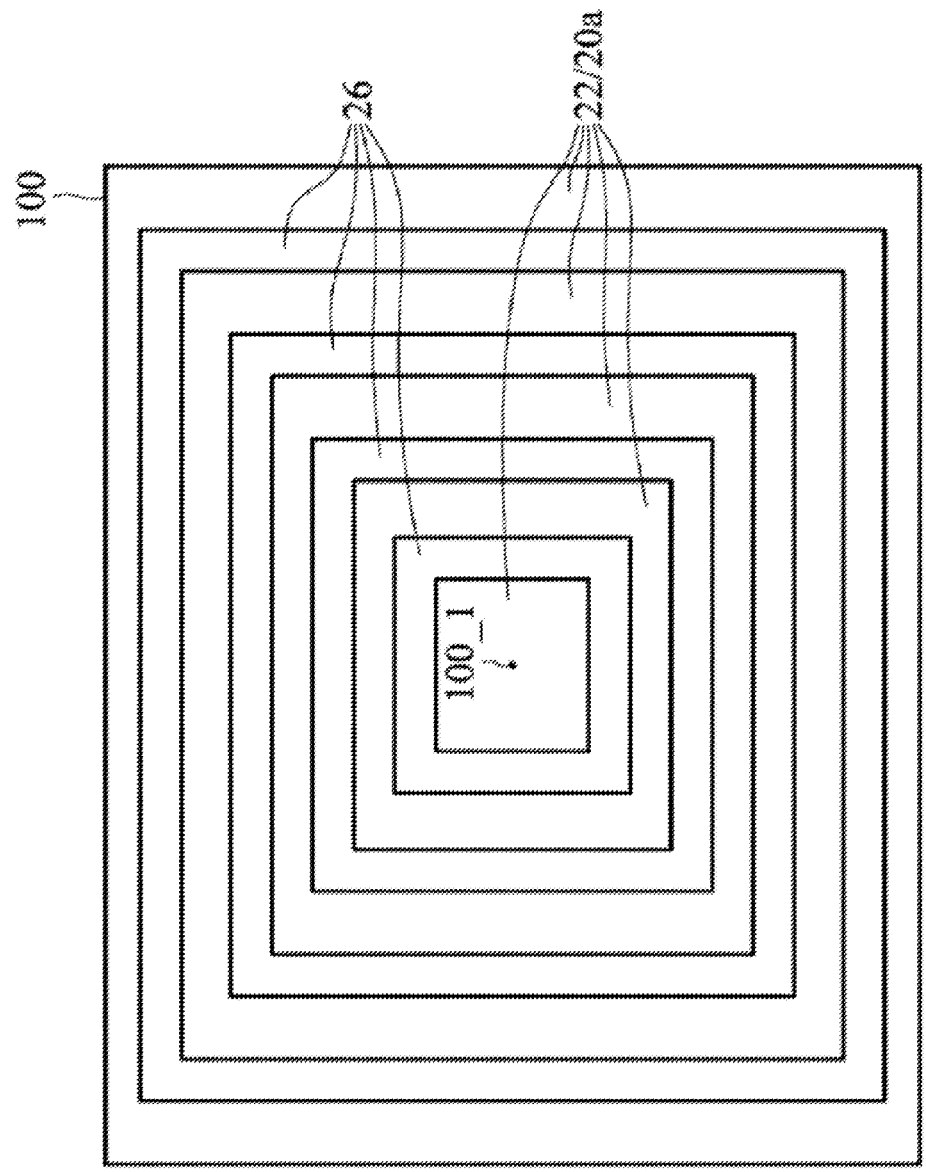

FIG. 3B illustrates a top view of the structure shown in FIG. 3A, wherein the cross-sectional view as shown in FIG. 3A is obtained in the plane crossing line 3A-3A in FIG. 3B. In an embodiment, trenches 26 have rectangular shapes with the respective widths and lengths close to each other (and hence trenches 26 have the shape of squares) in the top view. In alternative embodiments, as shown in FIG. 3C (a top view), trenches 26 may be long strips. In yet embodiments, as shown in FIG. 3D (also a top view), trenches 26 form closed loops, which may encircle center 100_1 of chip 100, or encircle other selected points in chip 100 other than center 100_1. The dimensions (such as lengths L1-L3 and widths W1-W3 in FIG. 3B) and spacings S (such as spacings S1 and S2 in FIG. 3B) of different trenches 26 may be the same as each other, or different from each other. Further, trenches 26 may be arranged in a periodic pattern or a random pattern.

In the etch step for forming trenches 26, the trenches' profiles in different regions of chip 100 may be adjusted by various known etching techniques and effects. For example, the micro-loading effect is known to affect the profiles for trenches having a width within a certain range. Other known etch techniques can also affect trench profiles, for example, using plasma bombardment or protective additives. Referring back to FIG. 3A, it is observed that slant angle $\alpha 1$ may be different from slant angle $\alpha 2$, and slant angle $\alpha 1$ may be greater (or smaller) than slant angle $\alpha 2$ by about 2 degrees, about 5 degrees, or even by about 10 degrees. In addition, slant angle $\alpha 2$ may be greater (or smaller) than slant angle $\alpha 3$ by about 2 degrees, about 5 degrees, or even greater than about 10 degrees. This may be achieved, for example, by adjusting width W1, width W2, and width W3 relative to each other, depending on the etch technique used. The desirable pattern-loading effects may also be achieved by adjusting spacing Si relative to spacing S2 and spacing S3. Accordingly, on chip 100, there exists a plurality of slant angles a that is different from each other.

Figure 4:
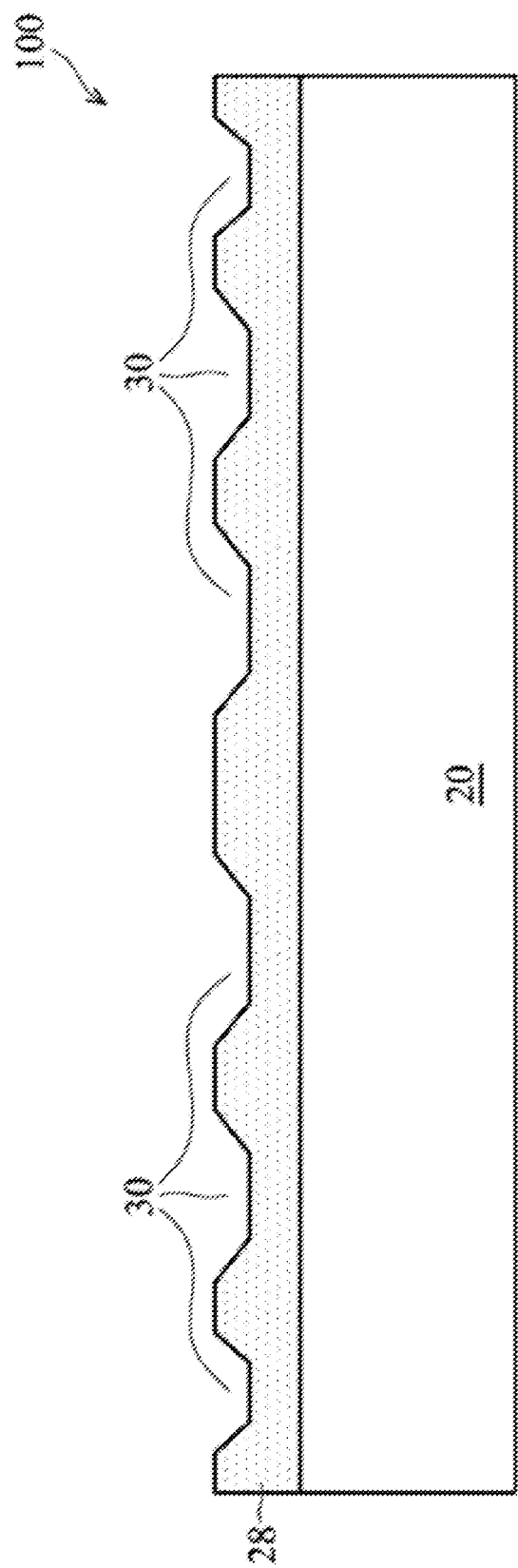

FIG. 4 illustrates a particular embodiment for forming trenches 26 (not shown in FIG. 4, please refer to FIGS. 3A-3D) with desirable slant angles. First, mask 28, which may comprise a polymer, is formed over substrate 20. Trenches 30 are formed in mask 28, for example, using laser micro-machining. The pattern of trenches 30 may be similar to the pattern of trenches 26. However, the aspect ratios of trenches 30 may be the same as, or different from, the respective aspect ratios of trenches 26. Mask 28 and the underlying substrate 20 are then etched using an etchant that attacks both substrate 20 and mask 28, with a desirable etching selectivity, for example, between about 0.5 and about 2. During the etching process, the exposed portions of substrate 20 and mask 28 are both etched when they are exposed to the etchant. However, in locations where the mask 28 is thicker, it takes more time to etch mask 28 before substrate 20 is exposed to the etchant. Accordingly, the pattern in mask 28 is transferred to substrate 20. In the embodiments wherein substrate 20 and mask 28 have a same etching rate (with etching selectivity close to 1), the patterns in mask 28 are transferred to the underlying substrate 20 substantially accurately. In the embodiments wherein substrate 20 has a greater etching rate than mask 28, trenches 26 (not shown in FIG. 4, please refer to FIG. 3A) have higher aspect ratios than the respective overlying trenches 30. Conversely, in the embodiments wherein substrate 20 has a lower etching rate than mask 28, trenches 26 have lower aspect ratios than the respective overlying trenches 30. The resulting textured substrate 20 is similar to the textured substrate 20 shown in FIG. 3A. In yet other embodiments, instead of using etching to form textured substrate 20, laser micro-machining may also be performed directly on substrate 20 to form trenches 26 with desirable profiles.

Figure 5:
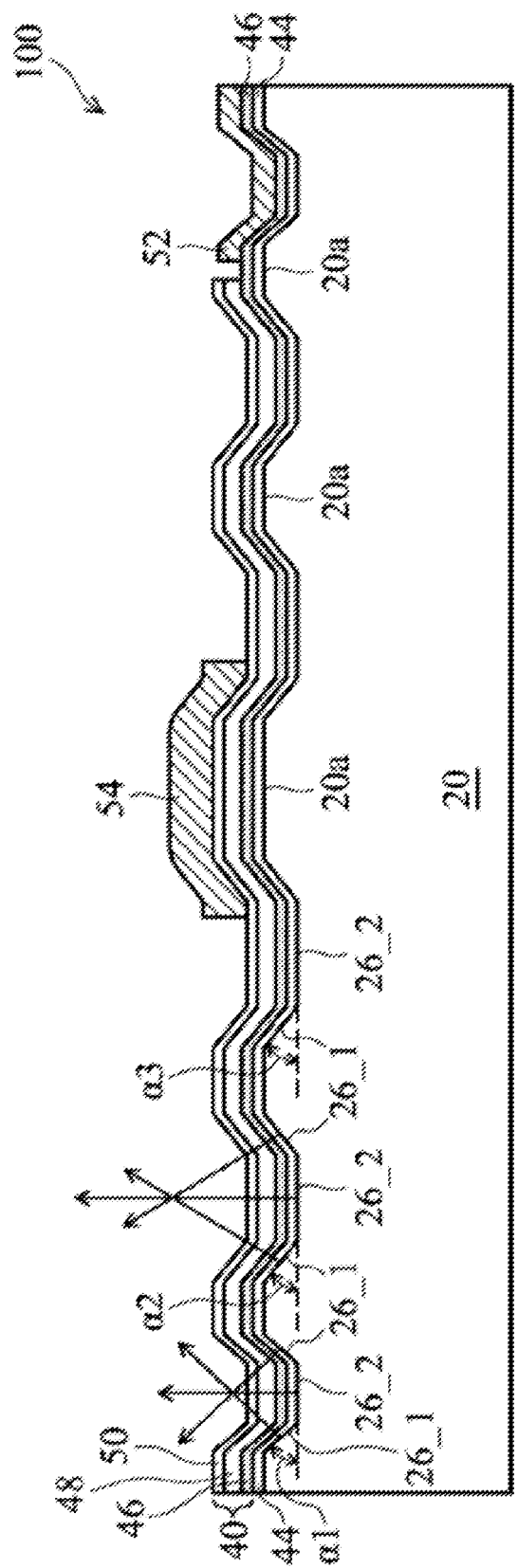

Next, as shown in FIG. 5, LED 40 is formed on the textured top surface of textured substrate 20. In an exemplary embodiment, buffer layer 44 is formed on substrate 20 and may contact the textured top surface of substrate 20. Buffer layer 44 may comprise un-doped gallium nitride. A plurality of layers of LED 40 is then formed on buffer layer 44. LED 40 may include cladding layer 46 of a first conductivity type over buffer layer 44, at least one multiple quantum well (MQW) 48 that acts as an active layer for emitting light over cladding layer 46, and cladding layer 50 of a second conductivity type opposite the first conductivity type over MQW 48. In an exemplary embodiment, cladding layer 46 is an n-GaN layer (GaN doped with an n-type impurity), MQW 48 is formed of InGaN, and cladding layer 50 is a p-GaN layer (GaN doped with a p-type impurity). Top electrodes (which are also bond pads formed of metals) 52 and 54 are formed to electrically connect to cladding layers 46 and 50, respectively. Accordingly, by applying a voltage between electrodes 52 and 54, LED 40 may be activated to emit light. It is realized that LED 40 may have many designs, which are also in the scope of the present disclosure. When the depths of trenches 26 are great enough, each of layers 44, 46, 48, 50, 52, and 54 may have portions extending into trenches 26. Alternatively, if trenches 26 are relatively shallow, only the lower ones of layers 44, 46, 48, 50, 52, and 54 have portions extending into trenches 26, while upper ones of these layer are over top surface 20a of substrate 20, which means that each of layers 44, 46, 48, 50, 52, and 54 comprises portions parallel to sidewalls 26_1, portions parallel to bottoms 26_2, and portions parallel to top surface 20a.

The formation methods of layers 46, 48, and 50 include epitaxial growth. Top electrodes 52 and 54 may be formed using a physical vapor deposition method, for example, sputtering, although other methods may also be used. The process details may be realized by one skilled in the art, and hence are not discussed in detail herein.

Layers 44, 46, 48, 50, 52, and 54 are non-flat layers, and may be conformal textured layers, which means that portions of these layers on sidewalls 26_1 of trenches 26 have substantially the same thickness as the portions of the respective layers at bottoms 26_2 of trenches 26, and substantially the same thickness as the portions of the respective layers on the un-etched portions of top surface 20a of substrate 20. Accordingly, each of layers 44, 46, 48, 50, 52, and 54 may follow the profile of the textured top surface of substrate 20.

In the cross-sectional view as shown in FIG. 5, it is observed that due to the different slant angles $\alpha$ (denoted as $\alpha 1$, $\alpha 2$, and $\alpha 3$) of sidewalls 26_1, active layer 48 includes portions having different slant angles. Therefore, the light emitted from different portions of active layer 48 with different slant angles a is directed to different directions. For example, FIG. 5 schematically illustrates five possible directions of light (although light is also emitted to other directions), which directions are perpendicular to the top surfaces of the respective portions of active layer 48. With more trenches 26 having different slant angles, the number of light directions is further increased. Accordingly, the light emitted by LED 40 is scattered more uniformly.

It is observed that with active layer 48 having a non-flat profile, the area of active layer 48 is increased over the case if active layer 48 is a flat layer parallel to the top surface 20a of substrate 20. Accordingly, the light output area is increased and the light amount emitted from a single chip is also increased. Further, the light emitted from the embodiments is scattered more uniformly, making it more suitable for illumination applications, such as light bulbs. The scattering of the light may be implemented by forming trenches directly in the substrates on which LEDs are formed, rather than package substrates. Accordingly, the embodiments provide a manufacturing process involving a low cost and low complexity.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A lighting apparatus, comprising:
   a substrate that includes a textured surface; and
   a light-emitting diode (LED) structure disposed over the textured surface of the substrate;
   wherein:
   the LED structure includes a first trench and a second trench; and
   the first trench and the second trench have different slant angles.

2. The lighting apparatus of claim 1, wherein the first trench and the second trench have different horizontal dimensions.

3. The lighting apparatus of claim 1, wherein the different slant angles are defined by sidewalls of the first trench and the second trench.

4. The lighting apparatus of claim 1, wherein at least one of the first trench and the second trench is shaped as a rectangle in a top view.

5. The lighting apparatus of claim 1, wherein at least one of the first trench and the second trench is shaped as a long strip in a top view.

6. The lighting apparatus of claim 1, wherein the first trench is encircled by the second trench in a top view.

7. The lighting apparatus of claim 1, wherein:
   the textured surface of the substrate includes a third trench and a fourth trench;
   the first trench is shaped substantially similar to the third trench; and
   the second trench is shaped substantially similar to the fourth trench.

8. The lighting apparatus of claim 1, wherein the LED structure is disposed conformally over the textured surface of the substrate.

9. The lighting apparatus of claim 1, wherein the LED structure includes a first cladding layer, a second cladding layer, and a multiple quantum well (MQW) layer disposed between the first and second cladding layers;
   and further comprising:
   a first electrode disposed on the first cladding layer; and
   a second electrode disposed on the second cladding layer.

10. A lighting apparatus, comprising:
    a substrate that includes a first trench and a second trench;
    a light-emitting diode (LED) structure disposed over the substrate, the LED structure including a first cladding layer, a second cladding layer, and a multiple quantum well (MQW) layer disposed between the first and second cladding layers;
    a first electrode electrically coupled to the first cladding layer; and
    a second electrode electrically coupled to the second cladding layer;
    wherein:
    the LED structure includes a third trench disposed over the first trench and a fourth trench disposed over the second trench;
    the first trench and the third trench each have a first slant angle; and
    the second trench and the fourth trench each have a second slant angle that is different from the first slant angle.

11. The lighting apparatus of claim 10, wherein the first trench and the second trench have different horizontal dimensions.

12. The lighting apparatus of claim 10, wherein the first slant angle is defined by the first trench, and the second slant angle is defined by the second trench.

13. The lighting apparatus of claim 10, wherein at least one of the first trench and the second trench is shaped as a rectangle in a top view.

14. The lighting apparatus of claim 10, wherein at least one of the first trench and the second trench is shaped as a long strip in a top view.

15. The lighting apparatus of claim 10, wherein the first trench is encircled by the second trench in a top view.

16. The lighting apparatus of claim 10, wherein the LED structure is disposed conformally over the substrate.

17. A lighting apparatus, comprising:
    a substrate that includes an upper surface that includes a plurality of trenches, wherein the trenches each have sidewalls and a bottom surface, and wherein at least some of the trenches have different slant angles than other trenches, wherein the trenches include a first trench and a second trench being encircled by the first trench in a top view; and
    a light-emitting diode (LED) structure disposed conformally over the upper surface of the substrate.

18. The lighting apparatus of claim 17, wherein at least some of the plurality of trenches have different horizontal dimensions from one another.

19. The lighting apparatus of claim 17, wherein at least one of the trenches is shaped as a rectangle or as a long strip in a top view.

* * * * *